(12) United States Patent
Wang

(10) Patent No.: US 7,923,299 B2
(45) Date of Patent: Apr. 12, 2011

(54) MANUFACTURING PROCESS FOR EMBEDDED SEMICONDUCTOR DEVICE

(75) Inventor: Chien-Hao Wang, Hsinchu County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 12/889,829

(22) Filed: Sep. 24, 2010

(65) Prior Publication Data
US 2011/0014751 A1    Jan. 20, 2011

Related U.S. Application Data

(62) Division of application No. 12/100,653, filed on Apr. 10, 2008, now Pat. No. 7,825,500.

(30) Foreign Application Priority Data

Jan. 30, 2008   (TW) ............................... 97103478 A

(51) Int. Cl.
*H01L 21/44* (2006.01)
*H01L 21/48* (2006.01)
*H01L 21/50* (2006.01)

(52) U.S. Cl. ............................... 438/121; 257/E23.173

(58) Field of Classification Search .................. 438/121; 257/E23.173
See application file for complete search history.

(56) References Cited

U.S. PATENT DOCUMENTS

| 2001/0027605 A1 | 10/2001 | Nabemoto et al. | |
| 2007/0145577 A1* | 6/2007 | Zeng et al. | 257/723 |
| 2009/0188703 A1* | 7/2009 | Ito et al. | 174/255 |

* cited by examiner

*Primary Examiner* — David S Blum
(74) *Attorney, Agent, or Firm* — J.C. Patents

(57) ABSTRACT

A manufacturing process for an embedded semiconductor device is provided. In the manufacturing process, at least one insulation layer and a substrate are stacked to each other, and a third metal layer is laminated on the insulation layer to embed a semiconductor device in the insulation layer. The substrate has a base, a first circuit layer, a second circuit layer, and at least a first conductive structure passing through the base and electrically connected to the first circuit layer and the second circuit layer. In addition, the third metal layer is patterned to form a third circuit layer having a plurality of third pads.

20 Claims, 10 Drawing Sheets

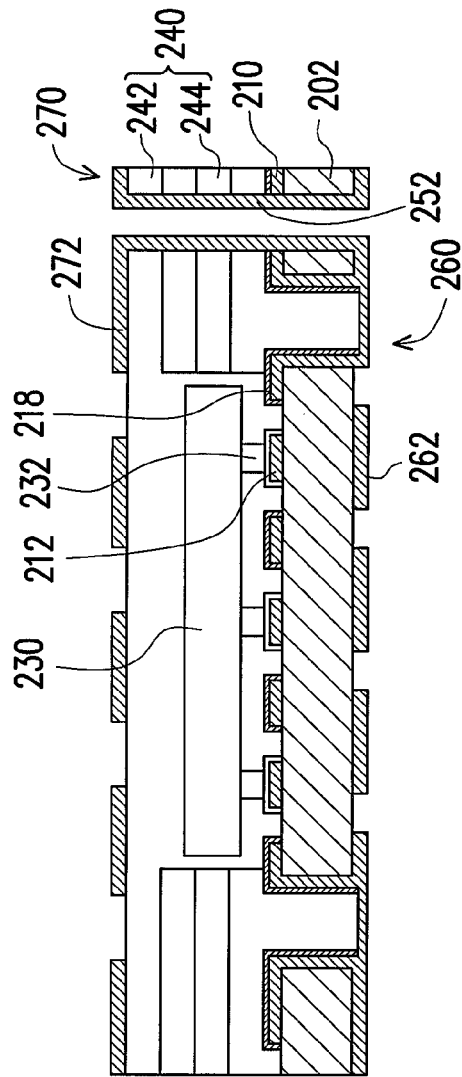
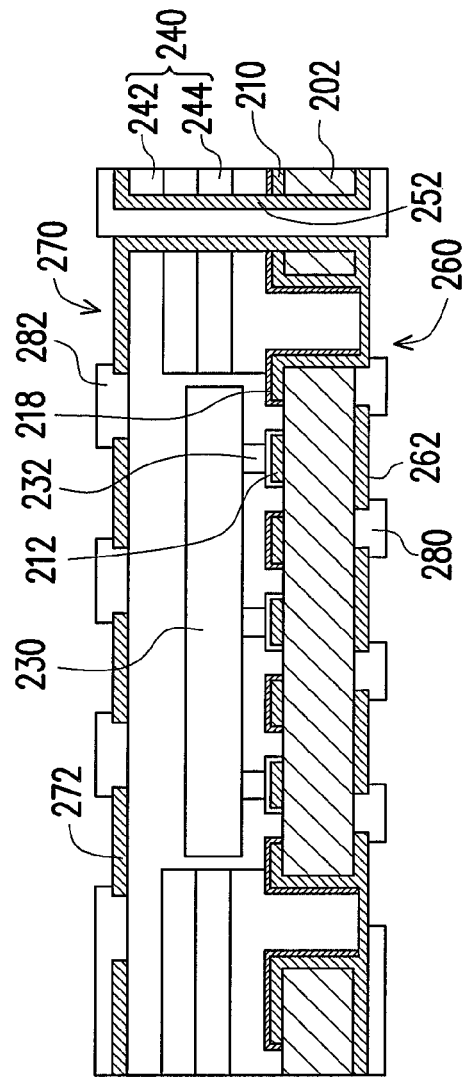
FIG. 2I
FIG. 2J

MANUFACTURING PROCESS FOR EMBEDDED SEMICONDUCTOR DEVICE

CROSS-REFERENCE TO RELATED APPLICATION

This application is a divisional application of and claims the priority benefit of an application Ser. No. 12/100,653, now U.S. Pat. No. 7,825,500, filed on Apr. 10, 2008, which claims the priority benefit of Taiwan application serial no. 97103478, filed on Jan. 30, 2008. The entirety of each of the above-mentioned patent applications is hereby incorporated by reference herein and made a part of this specification.

BACKGROUND OF THE INVENTION

1. Field of the Invention

The present invention relates to a semiconductor manufacturing process, and more particularly to a manufacturing process for an embedded semiconductor device.

2. Description of Related Art

As shown in FIG. 1, a conventional chip package structure 100 having a cavity mainly includes a carrier 110, a first chip 120, a second chip 130, and an encapsulant 140. The carrier 110 is usually composed of a substrate 111 and a heat dissipating plate 112. The substrate 111 has an upper surface 113, a bottom surface 114, and an opening 115. The heat dissipating plate 112 is adhered to the bottom surface 114 of the substrate 111, such that the opening 115 of the substrate 111 forms the cavity capable of accommodating chips. A plurality of first pads 116 and a plurality of second pads 117 are disposed on the upper surface 113 of the substrate 111. The first chip 120 is electrically connected to the first pads 116 via a plurality of first conductive wires 150. The second chip 130 is adhered to the first chip 120 and electrically connected to the second pads 117 through a plurality of second conductive wires 160. The encapsulant 140 covers the first chip 120 and the second chip 130 and encapsulates the first conductive wires 150 and the second conductive wires 160.

Note that the first pads 116 and the second pads 117 are required to be disposed on the same surface of the substrate 111. Hence, wire-bonding heights of the first conductive wires 150 and the second conductive wires 160 must be precisely controlled, so as to prevent the occurrence of short circuit caused by an excessively close wire-bonding distance or by a molding flow affecting the wires during a process of molding the encapsulant. As such, the second chip 130 is at a higher level than the upper surface 113 of the substrate 111, and thereby the wire-bonding height of the second conductive wires 160 is exaggerated, thus giving rise to an increase in the thickness of the chip package structure 100.

SUMMARY OF THE INVENTION

The present invention is directed to a manufacturing process for an embedded semiconductor device, in which the semiconductor device is embedded in a cavity through stacking a circuit board and a plurality of insulation layers and laminating a third metal layer on the insulation layers.

The present invention is further directed to a manufacturing process for an embedded semiconductor device. The manufacturing process is adapted to embedding a plurality of semiconductor devices in a cavity of insulation layers and carrying the semiconductor devices on a circuit layer above the insulation layer. Moreover, the manufacturing process can be applied to a multi-chip package-on-package (POP) structure.

The present invention provides a manufacturing process for an embedded semiconductor device. In the manufacturing process, a substrate is provided. Here, the substrate has a base, a first metal layer, a second metal layer, and at least a first conductive structure passing through the base and electrically connected to the first metal layer and the second metal layer. The first metal layer is disposed on a first surface of the base, while the second metal layer is disposed on a second surface of the base. The first metal layer is then patterned to form a first circuit layer having a plurality of first pads. Next, a roughening process is performed on the first circuit layer, the second metal layer and the first conductive structure to form a roughened layer. A semiconductor device is disposed on the first circuit layer and electrically connected to the first pads. Therefore, at least an insulation layer is formed to cover the first surface of the base, and a third metal layer is laminated on the insulation layer, so as to embed the semiconductor device in the insulation layer. At least a second conductive structure passing through the insulation layer and the first circuit layer and electrically connected to the second metal layer and the third metal layer is then formed. The second metal layer is patterned to form a second circuit layer having a plurality of second pads. The third metal layer is patterned to form a third circuit layer having a plurality of third pads. After that, a first solder mask is formed on the second circuit layer, while the second pads are exposed. A second solder mask is then formed on the third circuit layer, while the third pads are exposed.

The present invention provides a manufacturing process for an embedded semiconductor device. In the manufacturing process, a substrate is provided. Here, the substrate has a base, a first metal layer, a second metal layer, and at least a first conductive structure passing through the base and electrically connected to the first metal layer and the second metal layer. The first metal layer is disposed on a first surface of the base, while the second metal layer is disposed on a second surface of the base opposite to the first surface. The first metal layer is then patterned to form a first circuit layer having a plurality of first pads. Next, a roughening process is performed on the first circuit layer, the second metal layer and the first conductive structure to form a roughened layer, wherein the roughened layer is formed on the first circuit layer between the adjacent first pads. A semiconductor device is disposed on the first circuit layer and electrically connected to the first pads. Therefore, at least an insulation layer is formed to cover the first surface of the base, and a third metal layer is laminated on the insulation layer, so as to embed the semiconductor device in the insulation layer. At least a second conductive structure passing through the insulation layer and the first circuit layer and electrically connected to the second metal layer and the third metal layer is then formed. The second metal layer is patterned to form a second circuit layer having a plurality of second pads. The third metal layer is patterned to form a third circuit layer having a plurality of third pads. After that, a first solder mask is formed on the second circuit layer, while the second pads are exposed. A second solder mask is then formed on the third circuit layer, while the third pads are exposed.

The present invention further provides a package structure of an embedded semiconductor device. The package structure includes a circuit board, a semiconductor device, at least an insulation layer, and a third circuit layer. The circuit board has a base, a first circuit layer, a second circuit layer, and at least a first conductive structure passing through the base and electrically connected to the first circuit layer and the second circuit layer. The first circuit layer is disposed on a first surface of the base, while the second circuit layer is disposed on a second surface of the base. Herein, the first circuit layer further comprises a roughened layer. The semiconductor device is disposed on the circuit board and electrically connected to the first circuit layer. The insulation layer covers the circuit board and the semiconductor device. The third circuit layer is disposed on the insulation layer.

According to an embodiment of the present invention, the semiconductor device is a chip having a plurality of bumps electrically connected to the first pads.

According to an embodiment of the present invention, in a late stage of the manufacturing process, a first solder mask is further formed on the second circuit layer, while the second pads are exposed. Meanwhile, a second solder mask is formed on the third circuit layer, while the third pads are exposed. Thereafter, a second protecting layer is formed on the second pads, and a third protecting layer is formed on the third pads.

According to an embodiment of the present invention, in a late stage of the manufacturing process, a plurality of solder balls is further formed on the second pads.

According to one embodiment of the present invention, the insulation layer is made of prepreg.

According to one embodiment of the present invention, a first protecting layer is formed on the first pads before performing the roughening process. The material of the first protecting layer includes organic solderability preservative (OSP) or nickel gold alloy.

In the manufacturing process for the semiconductor device according to the present invention, the circuit board and the insulation layers are stacked to each other, and thereby the semiconductor device is embedded in the cavity of the insulation layers. As such, a subsequent molding step can be omitted, thus simplifying the entire manufacturing process.

In order to make the aforementioned and other objects, features and advantages of the present invention more comprehensible, several embodiments accompanied with figures are described in detail below.

BRIEF DESCRIPTION OF THE DRAWINGS

FIGS. 2H through 2K are flowcharts schematically depicting a late stage of the manufacturing process for the embedded semiconductor device according to the embodiment of the present invention.

DESCRIPTION OF EMBODIMENTS

Figure 1:
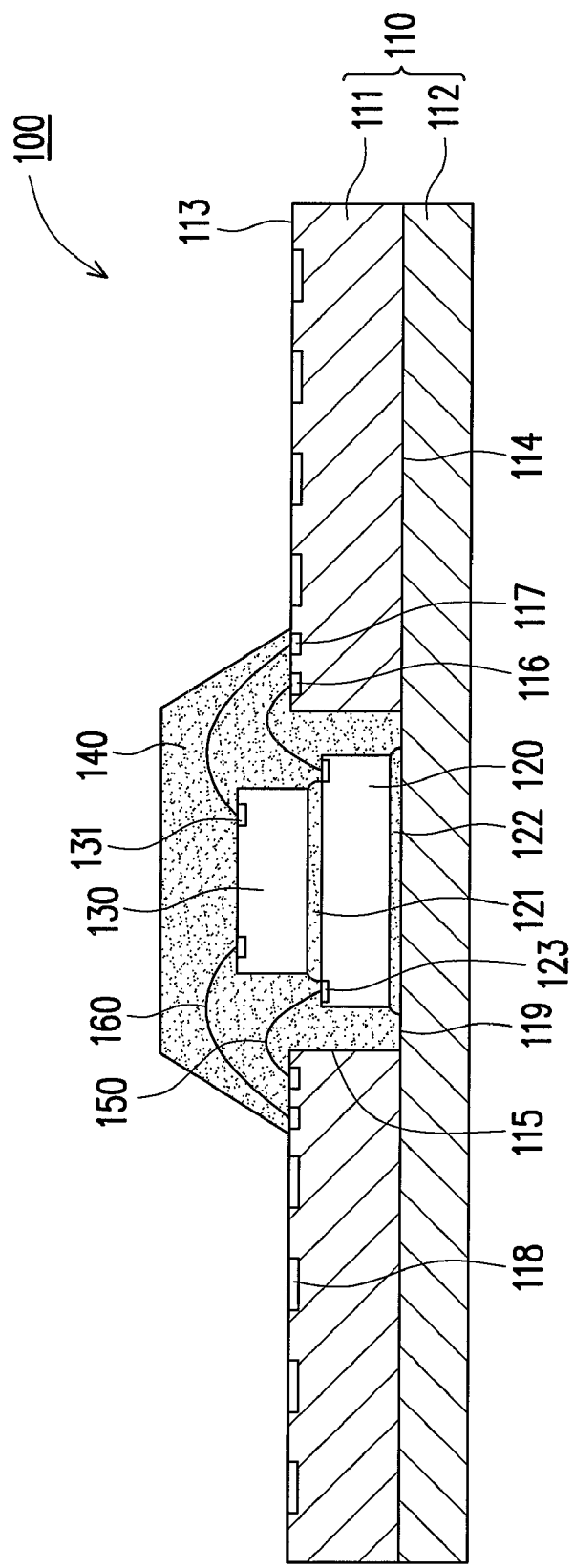
FIG. 1 is a schematic view illustrating a conventional chip package structure having a cavity.

FIGS. 2A through 2G are flowcharts schematically depicting an early stage of a manufacturing process for an embedded semiconductor device according to an embodiment of the present invention. FIGS. 2H through 2K are flowcharts schematically depicting a late stage of the manufacturing process for the embedded semiconductor device according to the embodiment of the present invention. Referring to the embodiment illustrated in FIGS. 2A and 2B, in the first step, a substrate 200 is provided. The substrate 200 has a base 202, a first metal layer 204, a second metal layer 206, and a first conductive structure 208 passing through the base 202 and electrically connected to the first metal layer 204 and the second metal layer 206. The first metal layer 204 is disposed on a first surface S1 of the base 202, while the second metal layer 206 is disposed on a second surface S2 of the base 202. In the second step, the first metal layer 204 is patterned to form a first circuit layer 210 having a plurality of first pads 212.

The substrate 200 is a multi-layered substrate, e.g., a copper foil substrate. The first metal layer 204 and the second metal layer 206 are formed by electroplating or laminating copper foil onto the base 202. The base 202 not only can be an insulated core base, but also can have built-up circuits or laminated circuits in which the insulation material is laminated. The first conductive structure 208 is usually formed by first implementing a laser drilling or a mechanical drilling and then performing an electroplating process or filling conductive paste to form a conductive layer on a wall of a through hole H1. Besides, the first conductive structure 208 is electrically connected to the first metal layer 204 and the second metal layer 206 for electrical transmission.

Figure 2A:
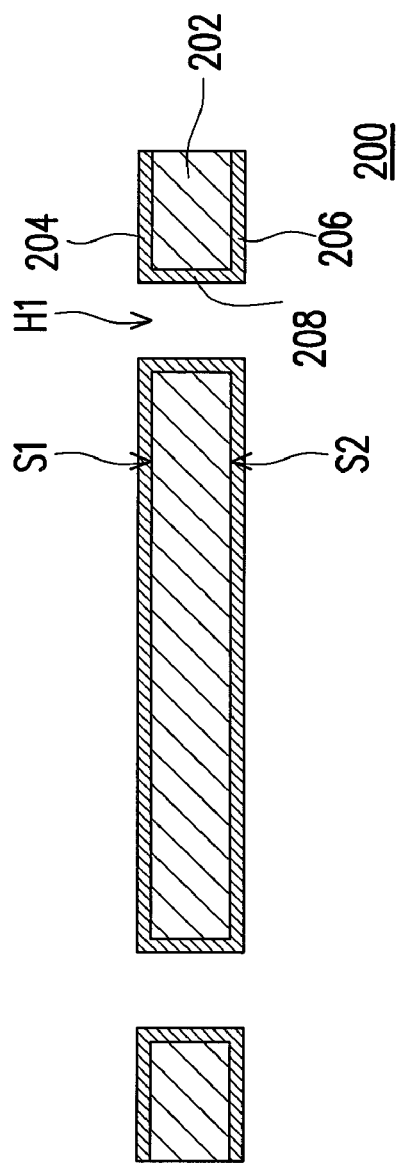
FIGS. 2A through 2G are flowcharts schematically depicting an early stage of a manufacturing process for an embedded semiconductor device according to an embodiment of the present invention.
Figure 2B:
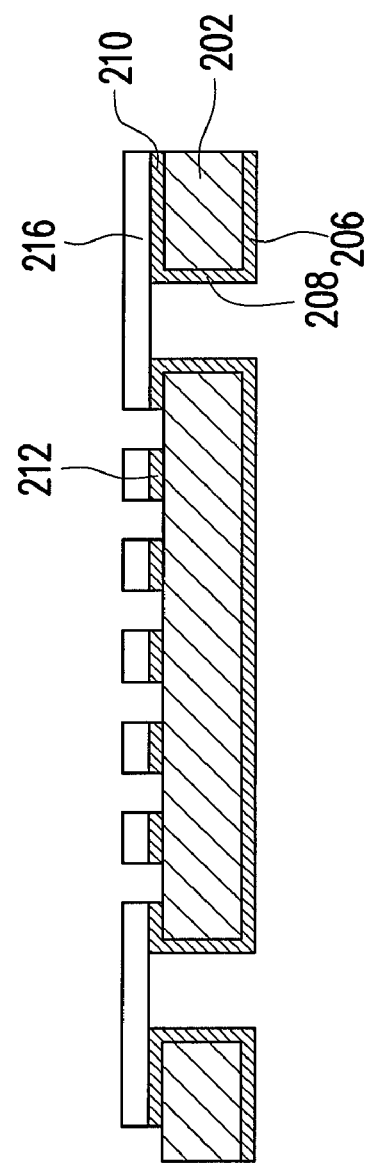

In FIG. 2B, the photoresist 216 is coated onto the first metal layer 204, for example. A patterning process including exposure, development, and etching steps is then carried out to form a first circuit layer 210 having the first pads 212. The photoresist 216 can be a photo-sensitive material, such as a dry film or liquid photoresist. After the implementation of the patterning process, the photoresist 216 may be removed by performing a lift-off process or by applying a solvent.

Figure 2C:
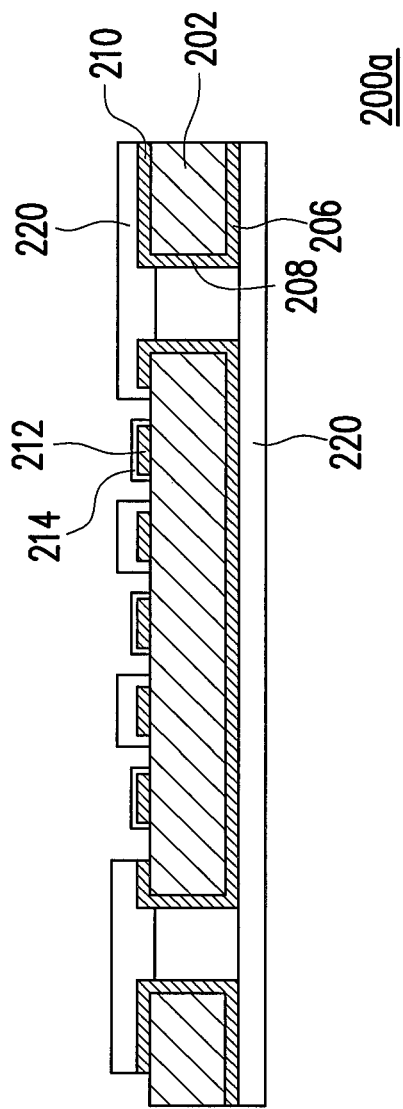
Figure 2D:
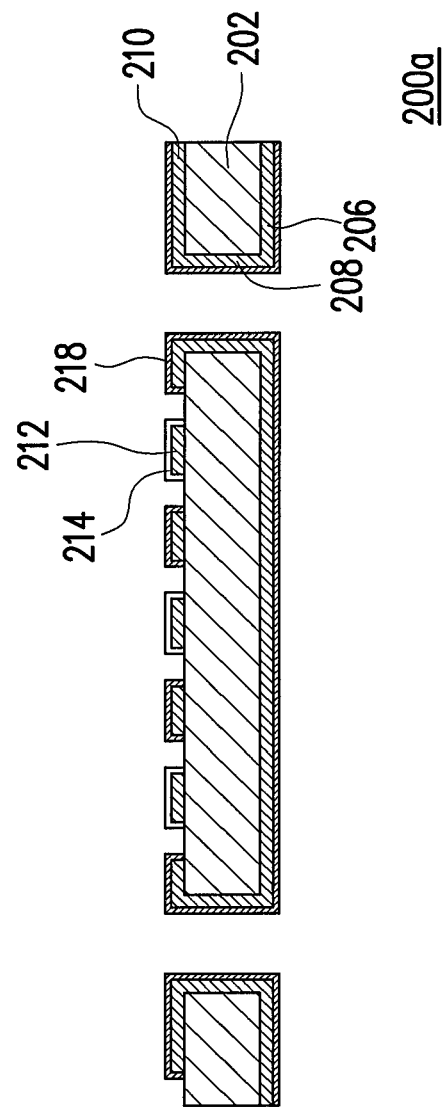

Next, referring to the embodiment depicted in FIGS. 2C and 2D, in the third step, a first protecting layer 214 is formed on the first pads 212. In the fourth step, a roughening process is performed on the first circuit layer 210, the second metal layer 206 and the first conductive structure 208, so as to form a roughened layer 218. In FIG. 2C, prior to the formation of the first protecting layer 214 in a circuit board 200a, the first circuit layer 210 and the second metal layer 206 are first covered by a mask 220, whereas the first pads 212 are exposed. After that, the first protecting layer 214 is formed on the first pads 212 by performing the electroplating process, an electroless plating process, or other processes. After the mask 220 is lifted off and removed, the roughening process is carried out, and thereby the roughened layer 218 is formed on the first circuit layer 210 and the second metal layer 206 in the first conductive structure 208. The first protecting layer 214 is an oxidation-resistant layer, for example, an OSP layer or a nickel gold layer, while the roughened layer 218 is, for example, an organic complex compound formed on a surface of copper processed with brown oxidation (a brown oxidation layer), or copper oxide or copper monoxide formed on a surface of copper processed with black oxidation (a black oxidation layer).

Figure 2E:
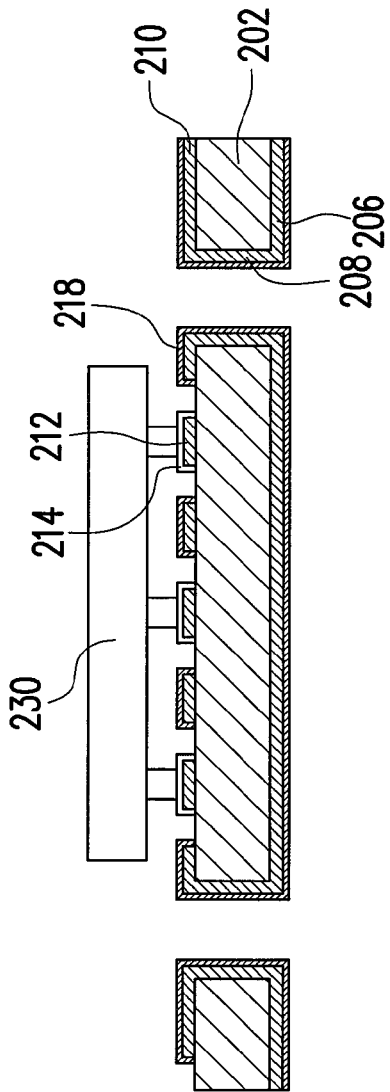
Figure 2F:
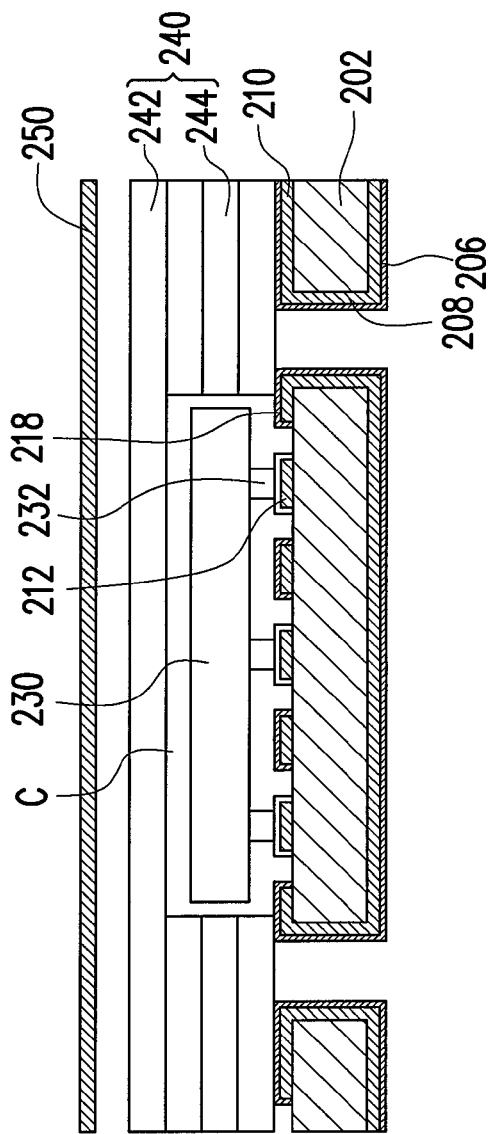
Figure 2G:
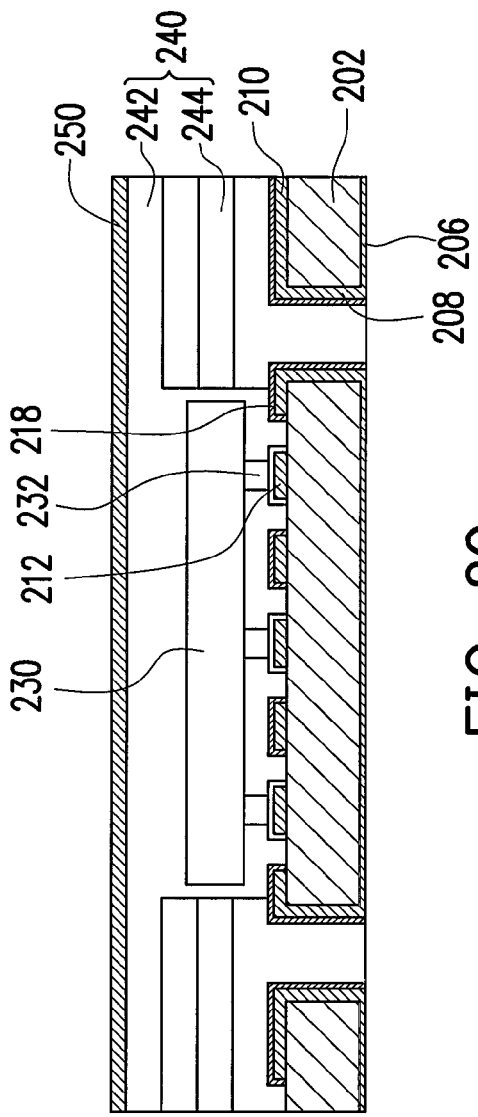

Thereafter, referring to the embodiment depicted in FIGS. 2E through 2G, in the fifth step, a semiconductor device 230 is disposed on the first circuit layer 210. The semiconductor device 230 is electrically connected to the first pads 212. In the sixth step, the first surface S1 of the base 202 is covered by one or more insulation layers 240, while a third metal layer 250 is laminated on the insulation layers 240. In FIG. 2F, the insulation layers 240 are formed by laminating a plurality of prepreg. The uppermost prepreg 242 is not processed and covers the underlying prepreg 244 which is processed to form a cavity C. Afterwards, the insulation layers 240 having the cavity C and the third metal layer 250 are laminated onto the first surface S1 of the base 202, so as to embed the semiconductor device 230 into the cavity C of the insulation layers

240 depicted in FIG. 2G. Here, the third metal layer 250 is, for example, a copper layer. The insulation layers 240 are in a semi-solid state. Accordingly, the insulation layers 240 can encapsulate the semiconductor device 230 after being laminated. In addition, the first conductive structure 208 can be filled with the insulation layers 240. After that, the insulation layers 240 can be heated and solidified.

The semiconductor device 230 can be a flip chip package having a plurality of bumps 232 electrically connected to the first pads 212, such as gold bumps, copper bumps, solder bumps, and so on. The roughened layer 218 is disposed between the adjacent first pads 212, so as to prevent the adjacent two bumps 232 from bridging together due to the implementation of a reflow process when the chips are bonded to the first pads 212 via the bumps 232. The bridging problem is more apt to occur when the bumps 232 on the chips are of high distribution density (i.e. fine pitch). In another embodiment, the semiconductor device 230 is a passive device having a plurality of electrodes, such as a capacitor, an inductor, or a resistor. The semiconductor device 230 is embedded in the insulation layers 240 in advance, and thus no subsequent molding step is required. Thereby, the manufacturing process is simplified.

Figure 2H:
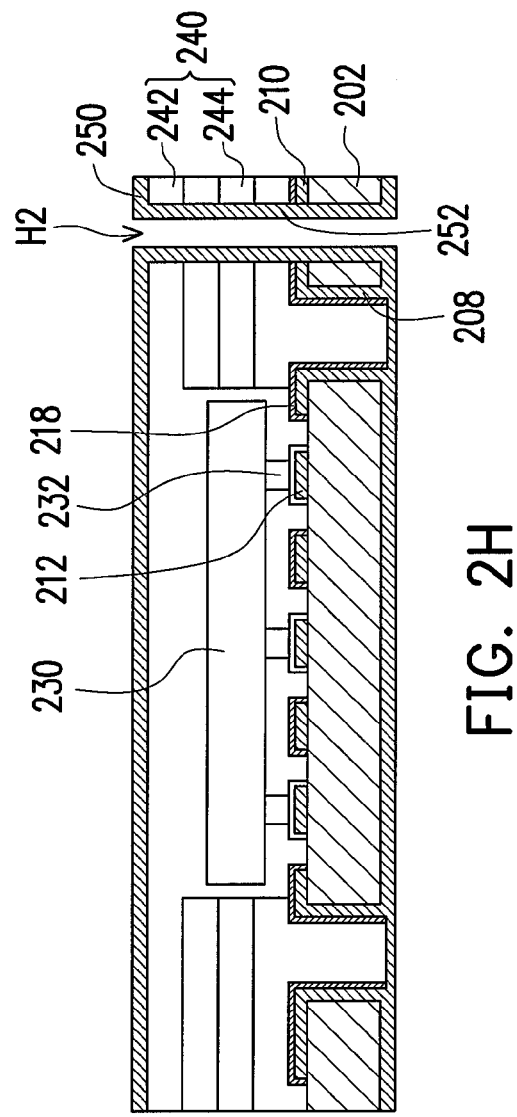

Please refer to the embodiment depicted in FIGS. 2H and 2I in which the late stage of the manufacturing process for the semiconductor device is elaborated. However, note that the present invention does not pose any limitation on the steps performed in said late stage. In the seventh step, a second conductive structure 252 passing through the insulation layers 240, the first circuit layer 210 and the base 202 and electrically connected to the second metal layer 206 and the third metal layer 250 is formed. In the eighth step, the second metal layer 206 is patterned to form a second circuit layer 260 having a plurality of second pads 262. The third metal layer 250 is patterned to form a third circuit layer 270 having a plurality of third pads 272. In FIG. 2H, the second conductive structure 252 is usually formed by first implementing the laser drilling or the mechanical drilling and then performing the electroplating process or filling the conductive films to form the conductive layer on the wall of the through hole H2. Besides, the second conductive structure 252 is electrically connected to the second metal layer 206 and the third metal layer 250 for electrical transmission. Thereafter, photoresist is coated onto the second metal layer 206 and the third metal layer 250, and the patterning process including the exposure, development, and etching steps are then carried out to form the required second circuit layer 260 and the third circuit layer 270.

Figure 2K:
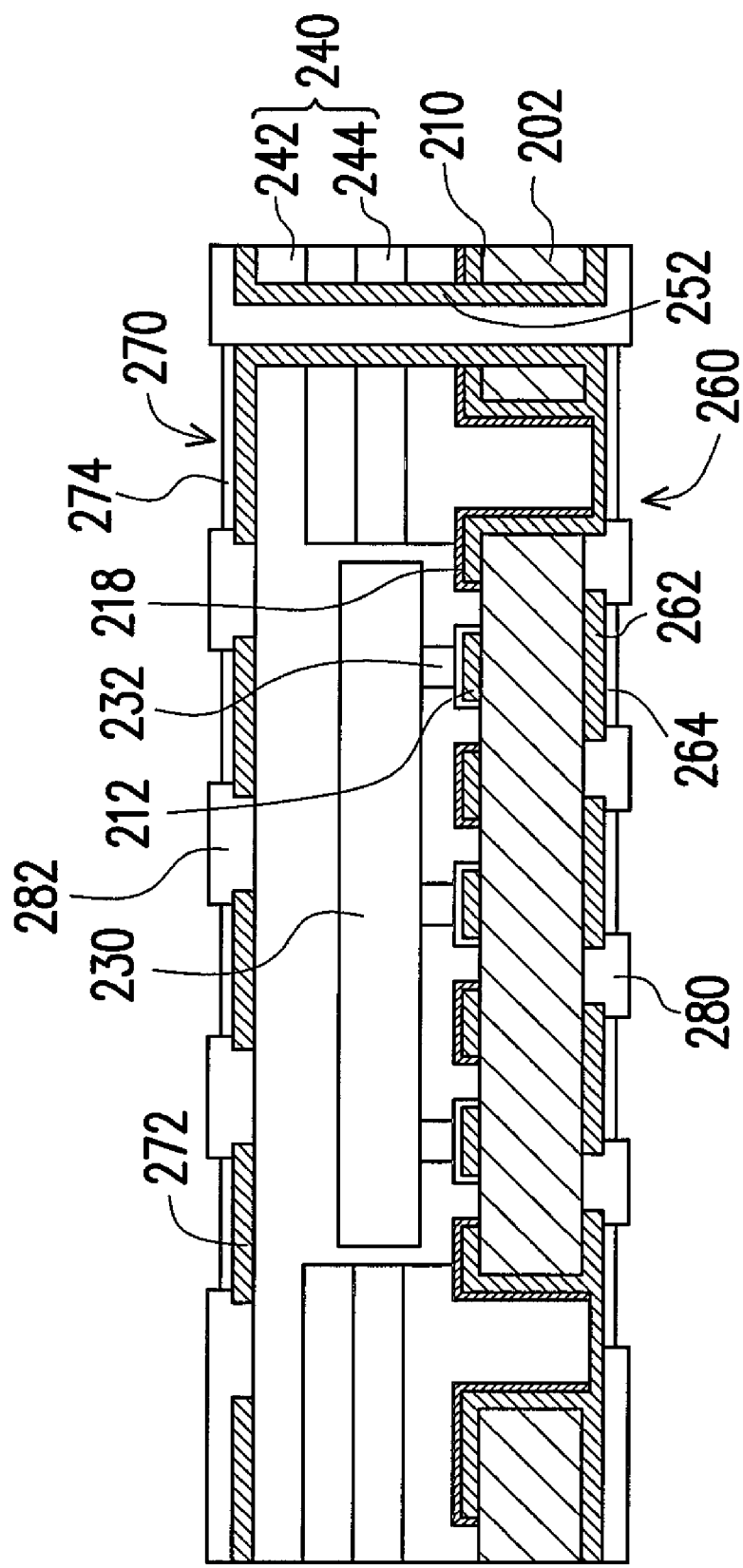

Next, referring to the embodiment depicted in FIGS. 2J through 2K, in the ninth step, a first solder mask 280 is formed on the second circuit layer 260, while the second pads 262 are exposed. A second solder mask 282 is formed on the third circuit layer 270, while the third pads 272 are exposed. In the tenth step, a second protecting layer 264 is formed on the second pads 262. A third protecting layer 274 is formed on the third pads 272. The first solder mask 280 and the second solder mask 282 are formed by stencil printing or spin coating and can be filled into the second conductive structure 252, so as to perform a solder-resistance function and to prevent the circuits from being oxidized. The material of the second and the third protecting layers 264 and 274 is, for example, an anti-oxidant, such as nickel gold alloy, tin, and so forth. Thereby, the copper is not oxidized, and bonding strengths between the pads and the solder balls, the bumps, or the conductive wires can be enhanced.

Figure 3A:
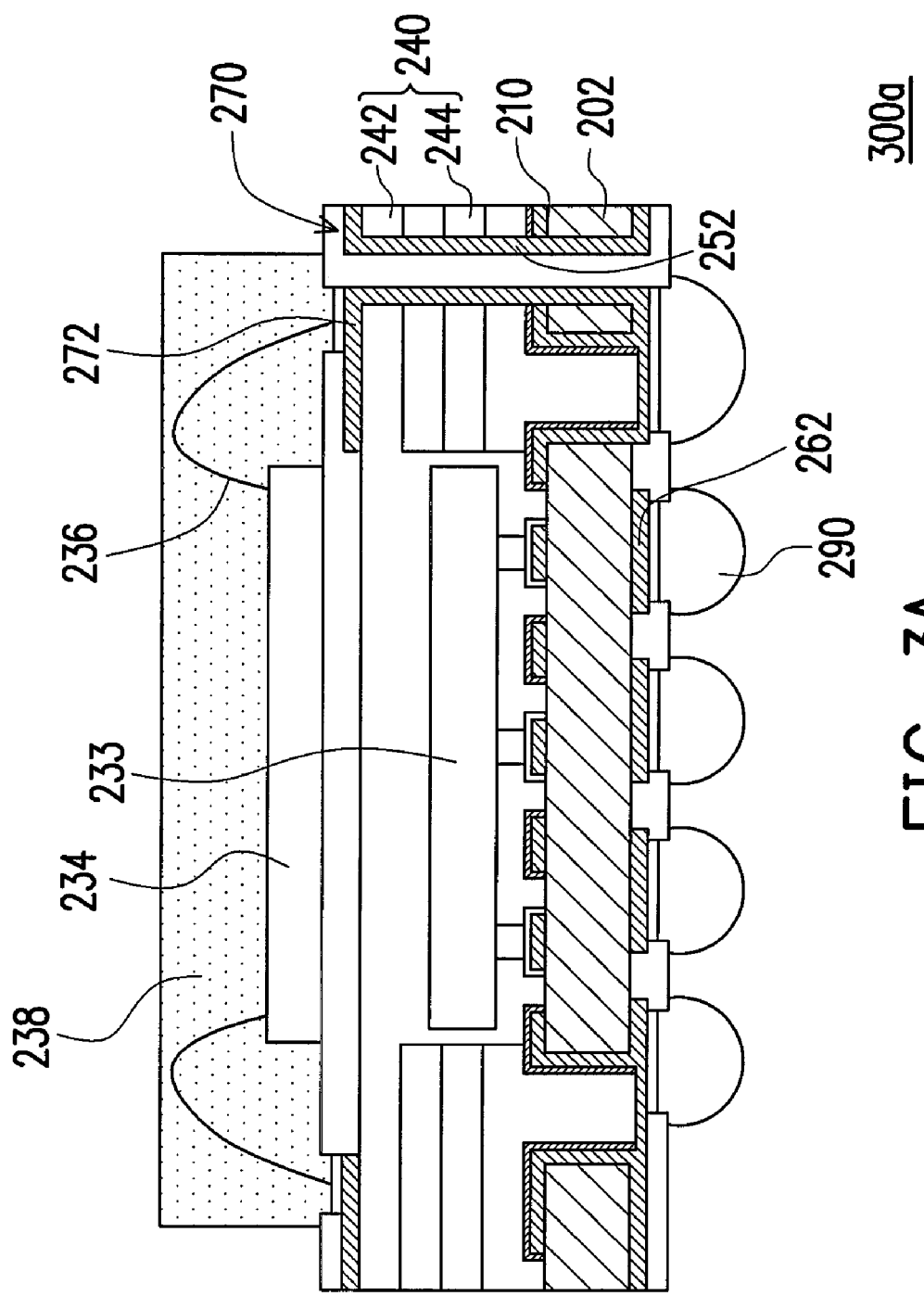
FIGS. 3A and 3B are schematic views respectively illustrating a multi-chip package structure according to an embodiment of the present invention.

A multi-chip manufacturing process for said chip package structure is described hereinafter with reference to the drawings. Referring to FIG. 3A, a multi-chip package structure 300a is equipped with a first chip 233 embedded in the insulation layers 240 and a second chip 234 disposed on the third circuit layer 270 and electrically connected to the third pads 272. The second chip 234 is electrically connected to the third pads 272 via a plurality of conductive wires 236. An encapsulant 238 covers the second chip 234 and closely seals and protects the conductive wires 236. A plurality of solder balls 290 is disposed on the second pads 262 for transmitting signals from the first and the second chips 233 and 234 to an external electronic device.

Figure 3B:
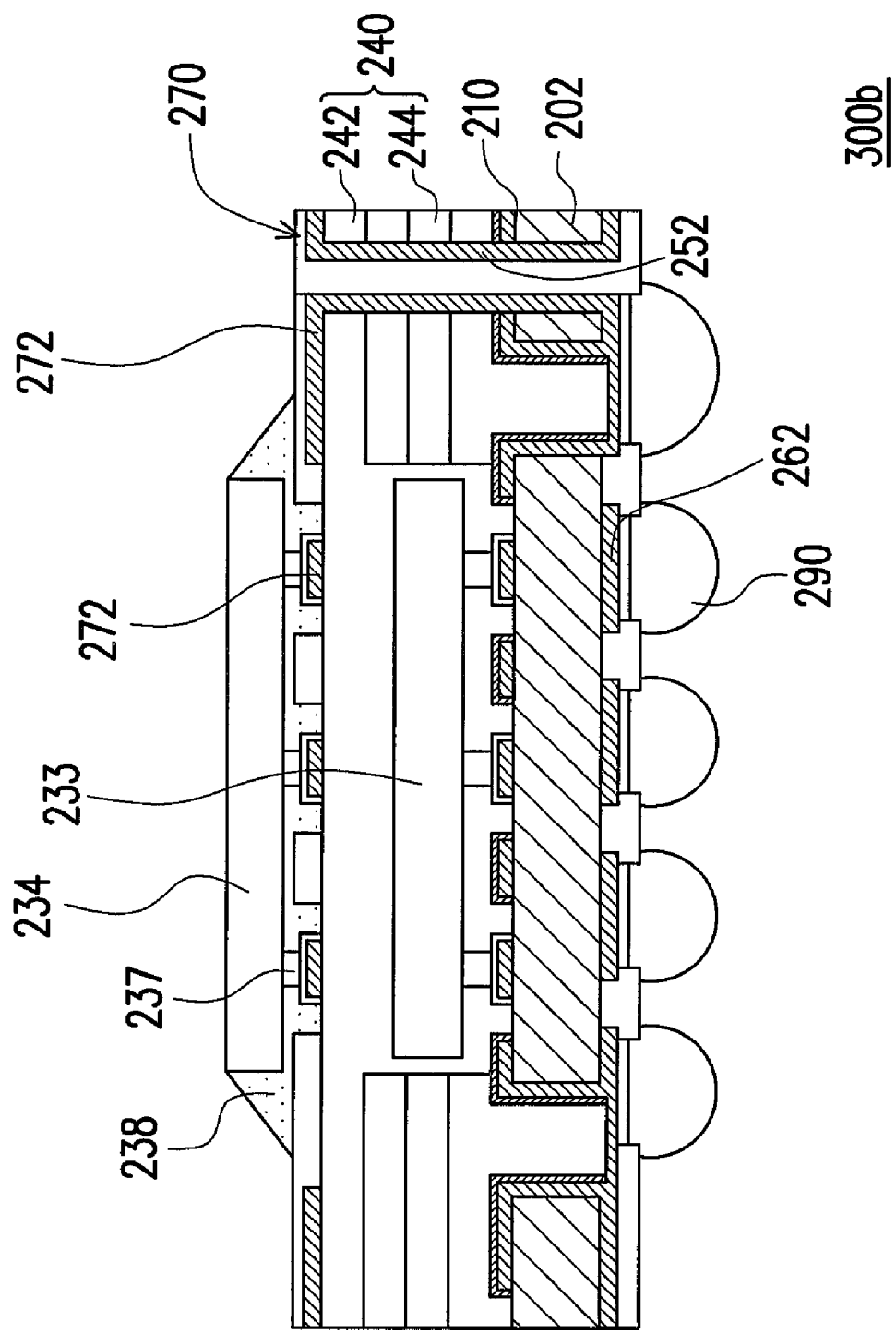

Next, referring to FIG. 3B, a multi-chip package structure 300b is equipped with the first chip 233 and the second chip 234. The first chip 233 is embedded in the insulation layers 240, and the second chip 234 is disposed on the third circuit layer 270 and electrically connected to the third pads 272. Here, the second chip 234 is electrically connected to the third pads 272 via a plurality of bumps 237. The encapsulant 238 is filled in a bottom portion of the second chip 234 and closely seals and protects the bumps 237. The plurality of solder balls 290 is disposed on the second pads 262 for transmitting the signals from the first and the second chips 233 and 234 to the external electronic device.

Figure 4:
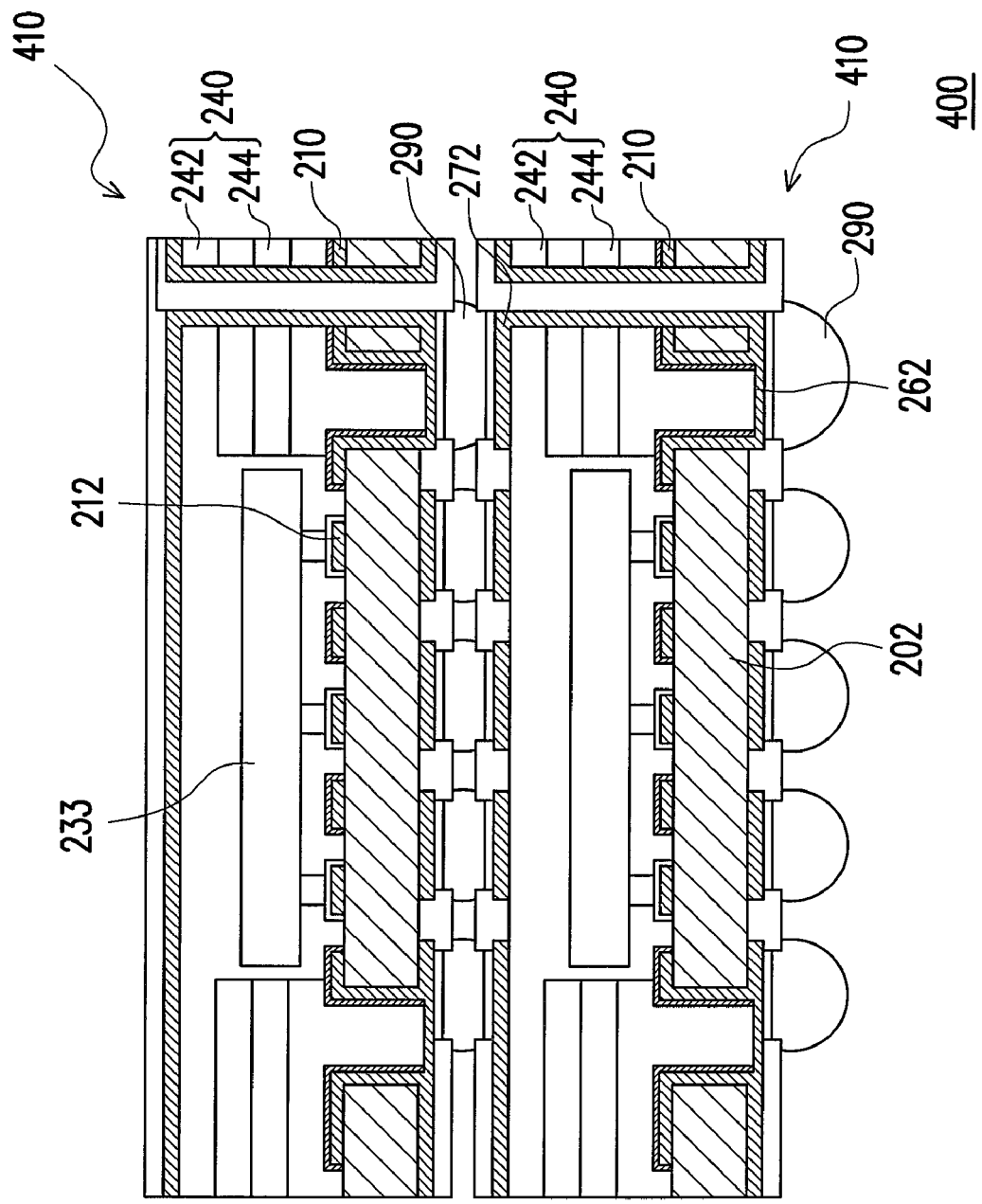
FIG. 4 is a schematic view of a stacked multi-chip package structure according to an embodiment of the present invention.

After that, referring to FIG. 4, a stacked multi-chip package structure 400 has two chip package structures 410 stacked to each other. Each of the chip package structures 410 has a chip 233 or another semiconductor device electrically connected to the first pads 212 of the first circuit layer 210, and the chip 233 is embedded in the insulation layers 240. The plurality of solder balls 290 is disposed on the second pads 262 and electrically connected between the two chip package structures 410 through the second pads 262 and the third pads 272, so as to transmit the signals from the two chips 233 to the external electronic device.

To sum up, in the manufacturing process for the semiconductor device according to the present invention, the circuit board and a plurality of insulation layers are stacked together, and the third metal layer is laminated onto the insulation layers. As such, the semiconductor device can be embedded in the cavity of the insulation layers, and no subsequent molding step is required. Thereby, the manufacturing process is simplified. Moreover, the package structure of the present invention is adapted to embedding a plurality of semiconductor devices in the cavity of the insulation layers and carrying the semiconductor devices on the circuit layer above the insulation layers, such that the multi-chip package structure is formed. Additionally, the package structure can be applied to a multi-chip POP structure. Furthermore, the roughened layer is disposed between the adjacent first pads, so as to improve reliability and to prevent the bumps from bridging together due to the implementation of the reflow process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing process for an embedded semiconductor device, comprising:
   providing a substrate having a base, a first metal layer, a second metal layer, and at least a first conductive structure passing through the base and electrically connected to the first metal layer and the second metal layer, the first metal layer being disposed on a first surface of the base, the second metal layer being disposed on a second surface of the base;

patterning the first metal layer to form a first circuit layer having a plurality of first pads;

performing a roughening process on the first circuit layer, the second metal layer and the first conductive structure to form a roughened layer;

disposing a semiconductor device on the first circuit layer, the semiconductor device being electrically connected to the first pads;

forming at least an insulation layer to cover the first surface of the base and laminating a third metal layer on the insulation layer, whereby embed the semiconductor device in the insulation layer;

forming at least a second conductive structure passing through the insulation layer and the first circuit layer and electrically connected to the second metal layer and the third metal layer;

patterning the second metal layer to form a second circuit layer having a plurality of second pads; and patterning the third metal layer to form a third circuit layer having a plurality of third pads.

2. The manufacturing process as claimed in claim 1, further comprising forming a first protecting layer on the first pads before performing the roughening process.

3. The manufacturing process as claimed in claim 2, wherein the material of the first protecting layer comprises an organic solderability preservative (OSP) or nickel gold alloy.

4. The manufacturing process as claimed in claim 1, further comprising forming a first solder mask on the second circuit layer and exposing the second pads.

5. The manufacturing process as claimed in claim 4, further comprising forming a second protecting layer on the second pads.

6. The manufacturing process as claimed in claim 4, further comprising forming a plurality of solder balls on the second pads.

7. The manufacturing process as claimed in claim 1, further comprising forming a second solder mask on the third circuit layer and exposing the third pads.

8. The manufacturing process as claimed in claim 7, further comprising forming a third protecting layer on the third pads.

9. The manufacturing process as claimed in claim 1, wherein the semiconductor device is a chip having a plurality of bumps electrically connected to the first pads.

10. The manufacturing process as claimed in claim 1, wherein the insulation layer is made of prepreg.

11. A manufacturing process for an embedded semiconductor device, comprising:

providing a substrate having a base, a first metal layer, a second metal layer, and at least a first conductive structure passing through the base and electrically connected to the first metal layer and the second metal layer, the first metal layer being disposed on a first surface of the base, the second metal layer being disposed on a second surface of the base opposite to the first surface;

patterning the first metal layer to form a first circuit layer having a plurality of first pads;

performing a roughening process on the first circuit layer, the second metal layer and the first conductive structure to form a roughened layer, wherein the roughened layer is formed on the first circuit layer between the adjacent first pads;

disposing a semiconductor device on the first circuit layer, the semiconductor device being electrically connected to the first pads;

forming at least an insulation layer to cover the first surface of the base and laminating a third metal layer on the insulation layer, whereby embed the semiconductor device in the insulation layer;

forming at least a second conductive structure passing through the insulation layer and the first circuit layer and electrically connected to the second metal layer and the third metal layer;

patterning the second metal layer to form a second circuit layer having a plurality of second pads; and patterning the third metal layer to form a third circuit layer having a plurality of third pads.

12. The manufacturing process as claimed in claim 11, further comprising forming a first protecting layer on the first pads before performing the roughening process.

13. The manufacturing process as claimed in claim 12, wherein the material of the first protecting layer comprises an organic solderability preservative (OSP) or nickel gold alloy.

14. The manufacturing process as claimed in claim 11, further comprising forming a first solder mask on the second circuit layer and exposing the second pads.

15. The manufacturing process as claimed in claim 14, further comprising forming a second protecting layer on the second pads.

16. The manufacturing process as claimed in claim 14, further comprising forming a plurality of solder balls on the second pads.

17. The manufacturing process as claimed in claim 11, further comprising forming a second solder mask on the third circuit layer and exposing the third pads.

18. The manufacturing process as claimed in claim 17, further comprising forming a third protecting layer on the third pads.

19. The manufacturing process as claimed in claim 11, wherein the semiconductor device is a chip having a plurality of bumps electrically connected to the first pads.

20. The manufacturing process as claimed in claim 11, wherein the insulation layer is made of prepreg.

* * * * *